US008314416B2

(12) United States Patent
Shkunov et al.

(10) Patent No.: US 8,314,416 B2
(45) Date of Patent: Nov. 20, 2012

(54) ORGANIC SEMICONDUCTOR FORMULATION

(75) Inventors: Maxim Shkunov, Southampton (GB); Richard Simms, Belfast (GB); Martin Heeney, Southampton (GB); Iain McCulloch, Southampton (GB)

(73) Assignee: Merck Patent GmbH, Darmstadt (DE)

( * ) Notice: Subject to any disclaimer, the term of this patent is extended or adjusted under 35 U.S.C. 154(b) by 1178 days.

(21) Appl. No.: 11/727,043

(22) Filed: Mar. 23, 2007

(65) Prior Publication Data
US 2007/0221916 A1  Sep. 27, 2007

(30) Foreign Application Priority Data

Mar. 24, 2006  (EP) ..................... 06006093

(51) Int. Cl.
 H01L 51/00 (2006.01)
 C08G 75/32 (2006.01)
(52) U.S. Cl. ............... 257/40; 524/262; 524/263
(58) Field of Classification Search ........ 524/262, 524/263; 257/40
See application file for complete search history.

(56) References Cited

U.S. PATENT DOCUMENTS

| 2004/0144975 | A1  | 7/2004  | Seki et al. |
| 2004/0188672 | A1* | 9/2004  | Spreitzer et al. ........... 257/40 |
| 2004/0245550 | A1* | 12/2004 | Afzali-Ardakani et al. .. 257/221 |
| 2005/0090640 | A1* | 4/2005  | Heeney et al. ............. 528/377 |
| 2005/0121728 | A1* | 6/2005  | Bao ........................ 257/369 |
| 2005/0202274 | A1  | 9/2005  | Elschner et al. |
| 2005/0236614 | A1  | 10/2005 | Parker et al. |
| 2006/0113510 | A1* | 6/2006  | Luo et al. ................. 252/500 |

FOREIGN PATENT DOCUMENTS

| EP | 1275650        | 1/2003 |
| EP | 1 441 399 A2   | 1/2004 |
| EP | 1564251        | 8/2005 |
| WO | WO 03/050147   | 6/2003 |
| WO | WO 03/050147 A1| 6/2003 |
| WO | WO 2005/057677 | 6/2005 |
| WO | WO-2005 091376 | 9/2005 |

OTHER PUBLICATIONS

Sirringhaus H et al., "Integrated, High-Mobility Polymer Field-Effect Transistors Driving Polymer Light-Emitting Diodes," Synthetic Metals, Elsevier Sequoia, Jun. 1999, vol. 102, pp. 857-860, XP000934322, ISSN: 0379-6779.
L. Burgi, Noncontact Potentiometry of Polymer Field-effect Transistors, Applied Physics Letters, vol. 89 No. 15, pp. 2913-2915, Apr. 22, 2002.
C.M. Hansen, Hansen Solubility Parameters, A User's Hand Book, pp. 1-25.
H. Sirringhaus, Integrated, High-Mobility Polymer Field-Effect Transistors Driving Polymer Light-Emitting Diodes, Elseiveier Sciences, Synthetic Metals 102(1998) pp. 857-860.
Japan Science and Technology Agency, "Organic vertical transistor and process for fabricating same," Publication Date: Sep. 25, 2005; Machine Translation of WO-2005 091376.

* cited by examiner

Primary Examiner — Ling Choi
Assistant Examiner — John Uselding
(74) Attorney, Agent, or Firm — Millen, White, Zelano, Branigan, P.C.

(57) ABSTRACT

Disclosed are formulations that contain an organic semiconducting compound, a hydrophobic surfactant containing a head group that is a chlorosilane, silazane or thiol group and a tail group that is an alkyl, fluoroalkyl or siloxane group, and a non-alcoholic organic solvent, and their uses in electrically conducting, photoconducting and semiconducting components and devices, for example, in integrated circuitry, organic field effect transistors, thin film transistors, organic photovoltaic devices, radio frequency identification tags and organic light emitting diodes.

25 Claims, No Drawings

ORGANIC SEMICONDUCTOR FORMULATION

This application claims priority to EP 06006093.6, which was filed Mar. 24, 2006.

Disclosed are an improved organic semiconductor formulation and to its use in electrically conducting, photoconducting and semiconducting components and devices.

Organic materials have shown promise as the active layers in organic field-effect transistors (OFETs), organic light emitting diodes (OLEDs) and organic photovoltaic devices (OPVs). OFETs are expected to find a wide use in smart cards, security tags and the switching elements in flat panel displays. Organic materials are envisaged to have substantial cost advantages over their silicon analogues if they can be deposited from solution, as this enables a fast, large-area fabrication route. Recent developments in high mobility OFETs indicate that hydrogenated amorphous silicon active matrix display drivers can be successfully replaced by their organic counterparts.

The performance of an OFET device is usually judged by: charge carrier mobility in the device, current On/Off ratio, position of threshold voltage, magnitude of the On and Off currents. The ability to achieve high transistor parameters in a solution deposition process (Roll-to-Roll, for example) with a minimum number of processing steps is considered to be a strong advantage.

The charge mobility of a FET device can be improved by pre-treatment of the surface of the semiconductor substrate before applying the semiconductor material. This is achieved for example by applying a silylating agent like HMDS (hexamethyldisilazane) or OTS (octyl trichlorosilane) or evaporating a capping layer of $SiO_x$ onto the surface, resulting in highly hydrophobic surfaces. For example, H. Sirringhaus et al., *Synthetic Metals* 102, 857-860 (1999) and L. Burgi et al., *Appl. Phys. Lett.* 80, 2913-2915 (2002) report that OFET substrates treated with HMDS show an ~20 times increase in mobility compared to untreated substrates for regio-regular P3HT used as semiconductor. The substrate treatment was performed before organic semiconductor deposition. However, the extra step of substrate pre-treatment makes the production of FET devices more costly and time-consuming.

Therefore, there is still a need for organic semiconductor materials for use in OFET devices that have high charge carrier mobility, On current and On/Off ratio, good processability especially from solution and allow for device preparation in an easy and time- and cost-effective way with a minimum number of processing steps.

An aspect of the present invention is to provide improved semiconductor materials having the above-mentioned properties and not having the disadvantages of the materials known from prior art. Other aims of the present invention are immediately evident to the person skilled in the art from the following detailed description.

It was found that these aims can be achieved by providing materials and methods as described herein. In a particular aspect, the inventors of the present invention found that by adding small amounts of surfactant to an organic semiconductor formulation it is possible to improve the charge mobility and On current of an OFET by up to ~10 times, and the On/Off ratio by ~5 times.

WO 03/050147 describes the preparation of nanoparticles and nanostructured layers of organic semiconductors by mixing an aqueous or alcoholic phase comprising a surfactant and an organic phase comprising one or more conjugated polymers in liquid form, producing a micro-emulsion or mini-emulsion, and optionally producing an aqueous dispersion, which is then coated on a substrate. However, phase-separated systems typically have abrupt boundaries that trap charge, have non-uniform phase distributions, exhibit anisotropic transport and are disadvantageous in charge transport devices.

US 2004/0144975 describes a coating composition having a low changing rate of the viscosity, and its use for preparing organic electroluminescent or semiconductor devices by an ink-jet printing method. The coating composition comprises a polar, glycol-based solvent such as diethylene glycol, monoethylene glycol or triethylene glycol, polythiophene derivatives as organic conductive material, and optionally an acetylene glycol surfactant. However, the use of polar solvents have limited use in practical semiconductor formulations as typically conjugated aromatic main-chain polymers are non-polar and thus are not compatible with polar solvents.

The invention in an aspect relates to a formulation, which is preferably a homogeneous solution, comprising one or more organic semiconducting compounds, one more surface-active compounds and one or more solvents selected from non-polar or non-alcoholic organic solvents.

The invention further relates to a semiconductor layer obtainable by providing a formulation as described above and below on a substrate and optionally removing the solvent.

The invention further relates to the use of a formulation or layer as described above and below as semiconducting, electrically conducting, photoconducting or light-emitting material in optical, electrooptical or electronic components or devices, organic field effect transistors (OFET), integrated circuitry (IC), thin film transistors (TFT), flat panel displays, radio frequency identification (RFID) tags, electroluminescent or photoluminescent devices or components, organic light emitting diodes (OLED), backlights of displays, organic photovoltaic devices (OPVs), sensor devices, charge injection layers, Schottky diodes, planarising layers, antistatic films, conducting substrates or patterns, electrode materials in batteries, photoconductors, electrophotographic applications, electrophotographic recording, organic memory devices, alignment layers, cosmetic or pharmaceutical compositions or for detecting and discriminating DNA sequences.

The invention further relates to a semiconducting, electrically conducting, photoconducting or light-emitting component or device, in particular an IC, OFET, TFT, OPV, RFID tag or OLED, characterized in that it comprises a formulation or layer as described above and below.

The invention further relates to a security marking or device, characterized in that it comprises an OFET or RFID tag as described above and below.

The organic semiconductor formulation according to the present invention has improved performance in Field-Effect Transistor (FET) applications compared to single-component formulations. It is based on a solution of a semiconducting polymer in an organic solvent. The addition of a surfactant improves FET mobility, On current and On/Off ratio. This method of improving OFET characteristics can be applied for current commercially available semiconducting materials, like for example poly-3-hexylthiophene (P3HT), and novel compounds. The semiconducting materials can be polymeric, oligomeric or small-molecule compounds. Devices are not limited to OFETs but can also be other types that benefit from improved interfacial charge carrier mobility, like for example OPVs or sensors.

Preferred embodiments of the present invention relate to an organic semiconductor formulation characterized in that:

the formulation is a homogeneous solution, which means that it is not phase-separated and is not e.g. a dispersion, emulsion, suspension, miniemulsion, microemulsion or micellar solution, the surfactants are monomeric or small-molecule compounds, the surfactants do not comprise an electron accepting group, the surfactants are selected from hydrophobic surfactants containing a head group capable of forming a covalent bond or a stable adsorption product with an active substrate, such as a chlorosilane, silazane or a thiol group, and further comprising a tail group selected from alkyl, fluoroaikyl or siloxane groups, the surfactants are selected from silanes or silazanes, the concentration of the surfactants is from $10^{31\ 5}$ to 5% wt., the formulation comprises one or more organic semiconducting compounds selected from polymers, the semiconducting compounds are p-type organic semiconductors, the semiconducting compounds are selected from polymers or copolymers comprising one or more units selected from optionally substituted thiophene, optionally substituted selenophene, 3-alkylthiophene, optionally substituted [3,2-b]-thienothiophene, optionally substituted [2,3-b]-thienothiophene and optionally substituted dithienotiophene, the concentration of the organic semiconducting compounds is from 0.1 to 10%, the organic solvents are selected from non-polar solvents, preferably having a polar contribution to the Hansen solubility parameter of <6 $Mpa^{1/2}$ [for definition and measurement see "Hansen Solubility Parameters: A User's Handbook" by Charles M. Hansen; CRC Press 1999; ISBN 0 849 31525 5], the organic solvents are selected from non-alcoholic solvents, the organic solvents are selected from aliphatic and aromatic hydrocarbons, halogenated aliphatic and aromatic hydrocarbons.

Suitable non-polar solvents are for example xylene, toluene, benzene, tetralin, indane, xylene, dichlorobenzene, chloroform, dichloromethane, cyclohexane, anisole, N-methyl-2-pyrrolidone (NMP), dimethyl sulfoxide (DMSO), cyclohexanone, dioxane, tetrahydrofuran (THF), γ-butyrolactone or mixtures thereof.

Suitable surfactants are for example compounds comprising hydrocarbon, fluorocarbon, siloxane or silane groups. Especially preferred are monomeric or small-molecule surfactants. Further preferred are nonionic surfactants, in particular silanes like for example HMDS (1,1,1,3,3,3-Hexamethyldisilazane), OTS (octyl trichlorosilane) or ODTS (octadecyl trichloro silane), fluorocarbon silanes like 1H-, 1H-, 2H-, 2H-perfluorooctyldimethylsilane or other silanes like optionally substituted trichlorosilane.

In principle all known semiconducting materials are suitable for use in the formulation according to the present invention, including, but not limited to, polymers such as polyalkylthiophenes, polythiophenes, polyfluorenes, polyphenylamines and their copolymers, oligomers, and small molecules such as pentacene or other polyacenes, or other fused ring compounds.

Especially suitable and preferred materials are polymers with charge-carrying properties, very preferably with conjugated pi-systems, like for example polymers selected from polyphenylenevinylene (PPV), polyarylenevinylene (PAV), polyparaphenylene (PPP), polypyridine (PPy), polypyridinevinylene (PPyV), polythiophene (PT), polyalkylthiophene (PAT), polyfluorene (PF), polyspirobifluorene (PSF), polypyrrole, polyvinylcarbazole, polytriarylamine, polyacetylene, polyphenylene sulfide, polythienylene vinylene, polyisothianaphthene, polyazulene, polyfuran, polyaniline, polyselenophene, polyindenofluorene, all of which substituted or unsubstituted, or mixtures, blends, statistical or defined copolymers or block copolymers of the above.

Substituted polymers preferably comprise one or more identical or different substituents selected from $C_1$-$C_{40}$ alkyl groups, $C_2$-$C_{40}$ alkenyl groups, $C_2$-$C_{40}$ alkynyl groups, $C_3$-$C_{40}$ allyl groups, $C_4$-$C_{40}$ alkyldienyl groups, $C_4$-$C_{40}$ polyenyl groups, $C_6$-$C_{18}$ aryl groups, $C_6$-$C_{40}$ alkylaryl groups, $C_6$-$C_{40}$ arylalkyl groups, $C_4$-$C_{40}$ cycloalkyl groups, $C_4$-$C_{40}$ cycloalkenyl groups, very preferably having one of the meanings of $R^a$ as given below.

Especially preferred are polymers and copolymers comprising one or more units selected from optionally substituted thiophene, optionally substituted selenophene, 3-alkylthiophene, optionally substituted [3,2-b]-thieno-thiophene, optionally substituted [2,3-b]-thienothiophene and optionally substituted dithienotiophene, as disclosed for example in WO 2005/014691 A2, WO 2005/111045 A1, EP 1 279 689 A2, EP 1 279 691 A1, EP 1 284 276 A1, EP 1 398 336 A1, EP 1 411 563 A2, EP 1 439 590 A2, EP 1 477 504 A1 and EP 1 510 535 A1. Very preferred are polymers of the following formulae

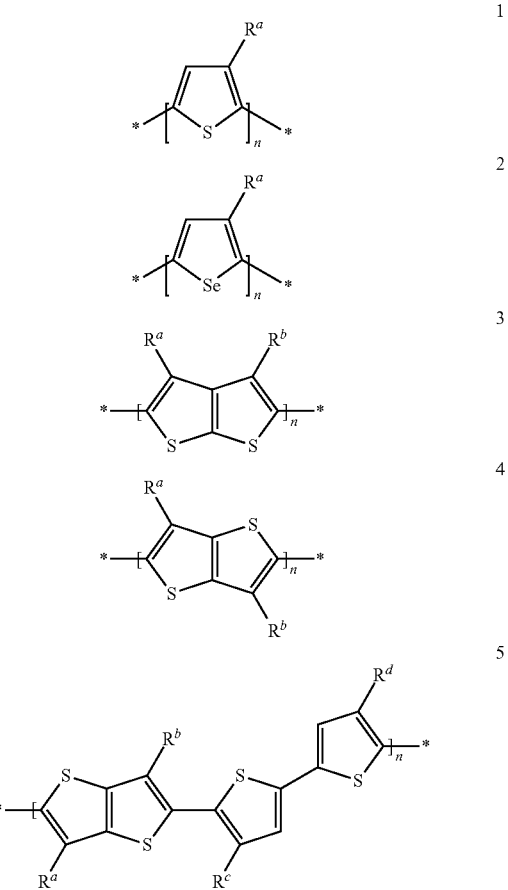

-continued

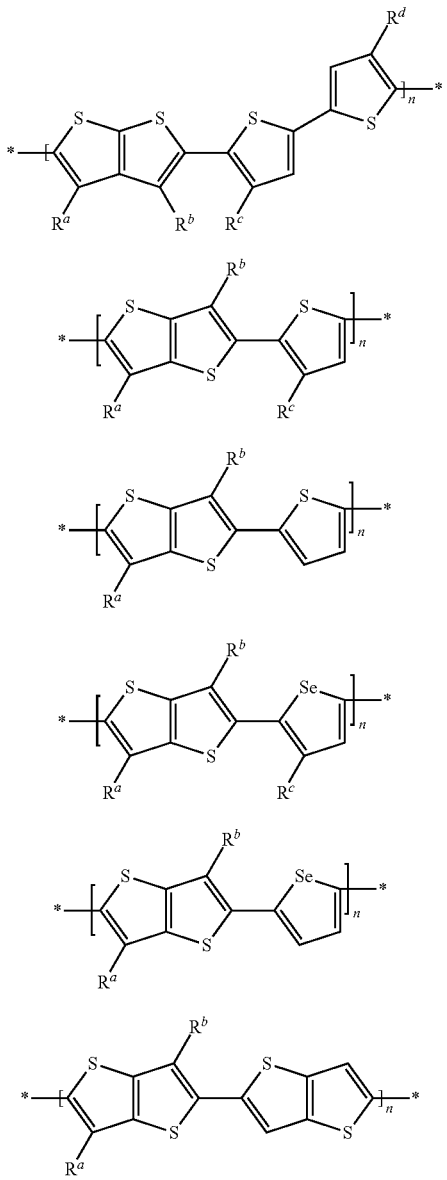

wherein
$R^a$, $R^b$, $R^c$, $R^d$ are independently of each other, and in case of multiple occurrence identical or different, selected from H, halogen, optionally substituted aryl or heteroaryl, or straight-hain, branched or cyclic alkyl with 1 to 20 C-atoms, which is optionally mono- or polysubstituted by F, Cl, Br, I or CN, and wherein one or more non-adjacent $CH_2$ groups are optionally replaced, in each case independently from one another, by —O—, —S—, —NH—, —$NR^0$—, —$SiR^0R^{00}$—, —CO—, —COO—, —OCO—, —O—CO—O—, —S—CO—, —CO—S—, —$CX^1$=$CX^2$— or —C≡C— in such a manner that O and/or S atoms are not linked directly to one another,
$R^0$ and $R^{00}$ are independently of each other H, optionally substituted aryl or alkyl with 1 to 12 C-atoms,
$X^1$ and $X^2$ are independently of each other H, F, Cl or CN,
n is an integer >1.
Very preferably $R^{a-d}$ are selected from $C_1$-$C_{20}$-alkyl that is optionally substituted with one or more fluorine atoms, $C_1$-$C_{20}$-alkenyl, $C_1$-$C_{20}$-alkynyl, $C_1$-$C_{20}$-alkoxy, $C_1$-$C_{20}$-thioalkyl, $C_1$-$C_{20}$-silyl, $C_1$-$C_{20}$-amino or $C_1$-$C_{20}$-fluoroalkyl, in particular from alkenyl, alkynyl, alkoxy, thioalkyl or fluoroalkyl, all of which are straight-chain and have 1 to 12, preferably 5 to 12 C-atoms, most preferably pentyl, hexyl, heptyl, octyl, nonyl, decyl, undecyl or dodecyl.

The formulation according to the present invention can additionally comprise one or more further components like for example lubricating agents, wetting agents, dispersing agents, hydrophobing agents, adhesive agents, flow improvers, defoaming agents, deaerators, diluents, reactive or non-reactive diluents, auxiliaries, colourants, dyes, pigments or nanoparticles, furthermore, especially in case crosslinkable binders are used, catalysts, sensitizers, stabilizers, inhibitors, chain-transfer agents or co-reacting monomers.

The formulation according to the present invention can be prepared by methods known in the art, for example by mixing one or more organic semiconducting compounds, one more surface-active compounds and one or more non-polar or non-alcoholic organic solvents as described above and below, or dissolving the compounds in the solvent(s).

The semiconductor formulations according to the present invention are useful as semiconducting, electrically conducting, photoconducting or light-emitting materials in optical, electrooptical or electronic components or devices, in particular in OFETs, OPVs or sensor devices, electrophotographic recording devices, and other semiconductor applications as described above and below. They are especially suitable for use in OFETs (e.g. for RFID tags or TFT applications) and OPVs, furthermore in components of OLED structures (like charge transport or emitting layers) for lighting or display applications.

The semiconductor formulation according to the present invention can also be used as an organic "metal" in applications including, but not limited to, charge injection layers and ITO planarising layers in organic light emitting diode applications, films for flat panel displays and touch screens, antistatic films, printed conductive substrates, patterns or tracts in electronic applications such as printed circuit boards and condensers.

OFETs where an organic semiconductive material is arranged as a film between a gate-dielectric and a drain and a source electrode, are generally known, for example from U.S. Pat. No. 5,892,244, WO 00/79617, U.S. Pat. No. 5,998,804 and from other references cited herein. Preferred applications of these FETs are for example integrated circuitry, TFT-displays and security applications.

In security applications, OFETs and other devices with semiconductive materials, like transistors or diodes, can be used for ID tags or security markings to authenticate and prevent counterfeiting of documents of value like banknotes, credit cards or ID cards, national ID documents, licenses or any product with money value, like stamps, tickets, shares, cheques and the like.

Alternatively, the semiconductors according to the invention can be used in OLEDs, for example in displays or as backlight of displays. Conventional OLEDs are typically realized by using multilayer structures. An emission layer is usually sandwiched between one or more electron-transport and/or hole-transport layers. By applying an electric voltage electrons and holes as charge carriers move towards the emission layer where their recombination leads to the excitation and hence luminescence of the lumophor units contained in the emission layer. The materials according to the present invention can be employed in one or more of the charge transport layers and/or in the emission layer, corresponding to their electrical and optical properties. The selection, characterization and processing of suitable monomeric, oligomeric and polymeric compounds or materials for the use in OLEDs is known and described for example in Meerholz, *Synthetic Materials* 111-112, 31-34 (2000) or Alcala, *J. Appl. Phys.* 88, 7124-7128 (2000) or the literature cited therein.

Semiconducting films or layers can be formed by providing a formulation according to the present invention onto a substrate and, if a solvent is present, removing the solvent. This can be done by well known techniques such as spin coating, dip coating, spray coating, brush coating or doctor blade coating, as well as printing techniques including but not limited to gravure printing, ink jet printing, stamping, screen printing, letter-press printing, roller printing, reverse-roller printing, offset lithography printing, flexographic printing, web printing, pad printing or other known printing methods.

Selected formulations of the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used to apply the organic semiconductor layer to a substrate. Additionally semi-industrial heads such as those manufactured by Brother, Epson, Konica, Seiko Instruments Toshiba TEC or single nozzle microdispensers such as those produced by Microdrop and Microfab may be used.

In order to be applied by ink jet printing or microdispensing, the mixture of the compound of formula I and the binder should be first dissolved in a suitable solvent. Solvents must fulfill the requirements stated above and must not have any detrimental effect on the chosen print head. Additionally, solvents should have boiling points >100° C., preferably >140° C. and more preferably >150° C. in order to prevent operability problems caused by the solution drying out inside the print head. Suitable solvents for printing include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

Preferred formulations for ink jet printing comprise a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the binder and the OSC compound which reduces or prevents clogging of the jets and separation of the components during spraying. The solvent(s) may include those selected from the following list of examples: dodecylbenzene, 1-methyl-4-tert-butylbenzene, terpineol limonene, isodurene, terpinolene, cymene, diethylbenzene. The solvent may be a solvent mixture, that is a combination of two or more solvents, each solvent preferably having a boiling point >100° C., more preferably >140° C. Such solvent(s) also enhance film formation in the layer deposited and reduce defects in the layer.

The ink jet fluid (that is mixture of solvent, surfactant and semiconducting compound) preferably has a viscosity at 20° C. of 1-100 mPa·s, more preferably 1-50 mPa·s and most preferably 1-30 mPa·s.

The semiconducting layer in a device according to the present invention is typically at most 1 micron (=1 µm) thick, although it may be thicker if required. The exact thickness of the layer will depend, for example, upon the requirements of the electronic device in which the layer is used. For use in an OFET or OLED, the layer thickness may typically be 500 nm or less.

The substrate used for preparing an OSC layer may include any underlying device layer, electrode or separate substrate such as silicon wafer, glass or polymer substrate for example.

An OFET device according to the present invention preferably comprises:
a source electrode,
a drain electrode,
a gate electrode,
an OSC layer as described above,
one or more gate insulator layers,
optionally a substrate, The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer.

The OFET device can be a top gate device or a bottom gate device. Suitable structures and manufacturing methods of an OFET device are known to the skilled in the art and are described in the literature, for example in WO 03/052841.

The gate insulator layer preferably comprises a fluoropolymer, like e.g. the commercially available Cytop 809M® or Cytop 107M® (from Asahi Glass). Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a perfluorosolvent. A suitable perfluorosolvent is e.g. FC75® (available from Acros, catalogue number 12380). Other suitable fluoropolymers and fluorosolvents are known in prior art, like for example the perfluoropolymers Teflon AF® 1600 or 2400 (from DuPont) or Fluoropel® (from Cytonix) or the perfluorosolvent FC 43® (Acros, No. 12377).

Throughout the description and claims of this specification, unless the context clearly indicates otherwise, as used herein plural forms of the terms herein are to be construed as including the singular form and vice versa. The words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

The invention will now be described in more detail by reference to the following examples, which are illustrative only and do not limit the scope of the invention.

Unless stated otherwise, in the foregoing and the following, all temperatures are given in degrees Celsius, and all percentages are by weight. All specific values of physical parameters like the permittivity ($\in$), charge carrier mobility ($\mu$), solubility parameter ($\delta$) and viscosity ($\eta$) as given above and below refer to a temperature of 20° C. (+/−1° C.). Ratios of monomers or repeating units in polymers are given in mol %. Ratios of polymers in polymer blends are given in weight %. The molecular weight of polymers is given as weight average molecular weight $M_w$ (GPC, polystyrene standard).

The Hansen parameter is determined as described in "Hansen Solubility Parameters: A User's Handbook" by Charles M. Hansen; CRC Press 1999; ISBN 0 849 31525 5.

Formulation viscosities are obtained using an automated microviscometer (available for example from Anton Paar GmbH, Graz, Austria), which is based on the rolling/falling ball principle. A capillary is used in which a small metal ball rolls and by tilting this one way or the other the ball will descent through the liquid and can be timed. The length of time taken to pass a set distance through the liquid is proportional to the viscosity and the angle at which the tube is held at during this determines the shear rate of the measurement—which, for a Newtonian liquid, should not affect the recorded viscosity.

EXAMPLE 1

A polymer based FET is prepared from a formulation containing the following semiconducting polymer P1 from 0.2 to 10% and 0.01% of silane (OTS) in xylene as organic solvent.

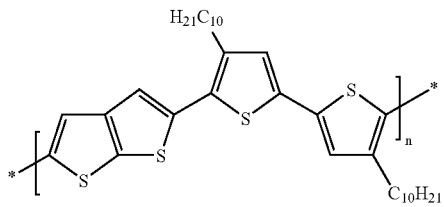

P1

The synthesis of P1 is described in EP 1 510 535 A1.

The warm formulation is deposited onto an ozone-cleaned (hydrophilic) Si/SiO$_2$ FET substrate with pre-defined gold source-drain electrodes and common Si-gate. After ~15 min the substrate is spun, resulting in a formation of a thin film of polymer P1 on the FET substrate. A control sample is prepared from the pristine P1-polymer solution in xylene following the same procedure as the above sample. The electrical characterization of the transistor devices was carried out in dry nitrogen atmosphere using computer controlled Agilent 4155C Semiconductor Parameter Analyser. Field-effect mobility was calculated in saturation regime, where drain current is expressed as:

$$I_d^{sat} = \frac{WC_i}{2L}\mu^{sat}(V_g - V_{th})^2 \qquad (1)$$

where W is the channel width, L the channel length, $C_i$ the capacitance of insulating layer, $V_g$ the gate voltage, $V_{th}$ the threshold voltage.

$V_{th}$ is estimated from linear fit of $\sqrt{I_d^{sat}}$ vs. $V_g$, and mobility is extracted from the slope of the linear fit according to formula (1). The results are summarised in Table 1 below.

TABLE 1

Electrical properties of OFETs fabricated from pristine polymer solution and from formulation containing OTS

| On/Off ratio | | FET On Current (A); Saturated regime | | FET Mobility (cm$^2$/Vs); Saturated regime | |
|---|---|---|---|---|---|
| Pristine | With OTS | Pristine | With OTS | Pristine | With OTS |
| $2 \times 10^4$ | $9 \times 10^4$ | $7.2 \times 10^{-6}$ | $6.0 \times 10^{-5}$ | $5.2 \times 10^{-4}$ | $4.7 \times 10^{-3}$ |

As can be seen from table 1, the use of a formulation according to the invention comprising the surfactant OTS increases the FET On Current and FET Mobility at ~10 times, compared to the pristine solution without OTS.

The entire disclosures of all applications, patents and publications, cited herein and of corresponding European application No. 06006093.6, filed Mar. 24, 2006, are incorporated by reference herein.

The preceding examples can be repeated with similar success by substituting the generically or specifically described reactants and/or operating conditions of this invention for those used in the preceding examples.

From the foregoing description, one skilled in the art can easily ascertain the essential characteristics of this invention and, without departing from the spirit and scope thereof, can make various changes and modifications of the invention to adapt it to various usages and conditions.

The invention claimed is:

1. A formulation comprising
   an organic semiconducting compound,
   a hydrophobic surfactant containing a head group that is a chlorosilane containing a silicon-chlorine bond, silazane or thiol group and a tail group that is an unsubstituted alkyl group, or a fluoroalkyl group or a siloxane group, and
   a non-alcoholic organic solvent.

2. A formulation according to claim 1, which is a homogeneous solution.

3. A formulation according to claim 1, wherein the surfactant is monomeric or a small-molecule compound.

4. A formulation according to claim 1, wherein the surfactant is a silane or silazane.

5. A formulation according to claim 1, wherein the surfactant is 1,1,1,3,3,3-Hexamethyldisilazane, octyl trichlorosilane, octadecyl trichloro silane, or a substituted trichlorosilane.

6. A formulation according to claim 1, wherein the concentration of the surfactant is 10$^{-5}$ to 5 wt. %.

7. A formulation according to claim 1, wherein the organic semiconducting compound is a p-type organic semiconductor.

8. A formulation according to claim 1, wherein the organic semiconducting compound is a polymer with a conjugated pi-system.

9. A formulation according to claim 1, wherein the organic semiconducting compound is polyphenylenevinylene, polyarylenevinylene, polyparaphenylene, polypyridine, polypyridinevinylene, polythiophene, polyalkylthiophene, polyfluorene, polyspirobifluorene, polypyrrole, polyvinylcarbazole, polytriarylamine, polyacetylene, polyphenylene sulfide, polythienylene vinylene, polyisothianaphthene, polyazulene, polyfuran, polyaniline, polyselenophene, polyindenofluorene, all of which are substituted or unsubstituted, or a mixture, blend, statistical or defined copolymer or block copolymer thereof.

10. A formulation according to claim 1, wherein the organic semiconducting compound is a polymer or copolymer comprising one or more units of optionally substituted thiophene, optionally substituted selenophene, 3-alkylthiophene, optionally substituted [3,2b]-thienothiophene, optionally substituted [2,3b]-thienothiophene or optionally substituted dithienotiophene.

11. A formulation according to claim 1, wherein the organic semiconducting compound is of the following formula

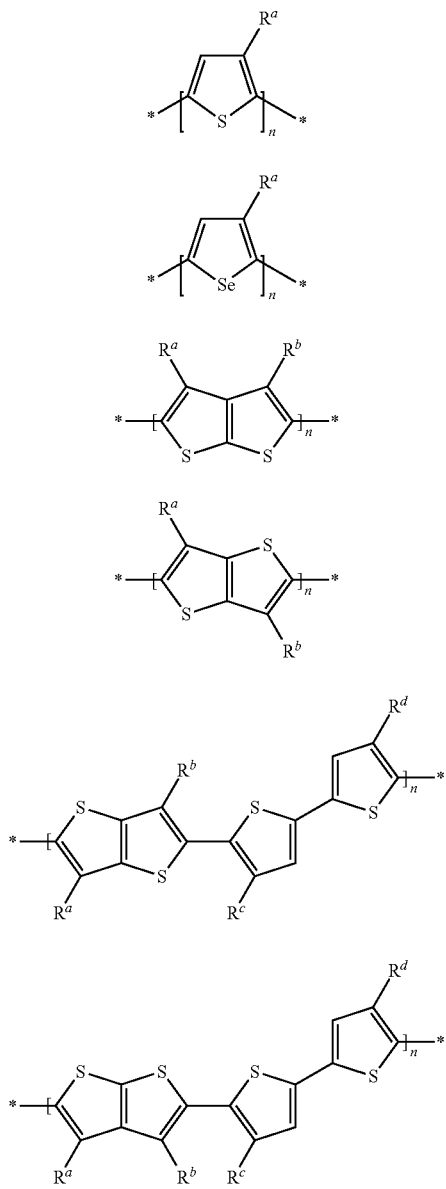

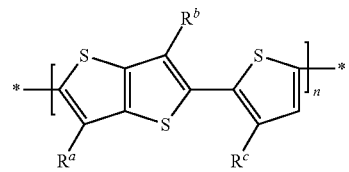

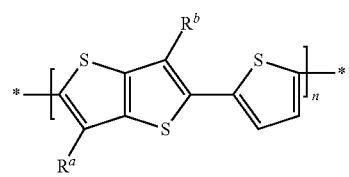

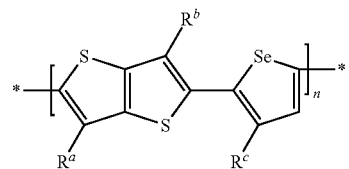

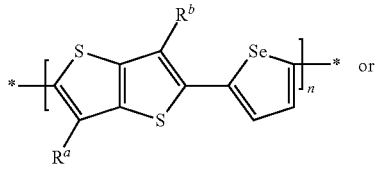

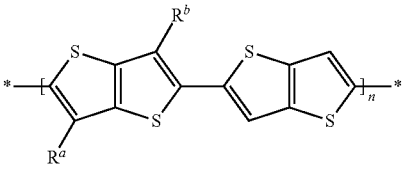

wherein
$R^a$, $R^b$, $R^c$, $R^d$ are, independently of each other, in each case, H, halogen, optionally substituted aryl or heteroaryl, or straight-hain, branched or cyclic alkyl with 1 to 20 C-atoms, which is optionally mono- or polysubstituted by F, Cl, Br, I or CN, and in which one or more non-adjacent $CH_2$ groups are optionally replaced, in each case independently from one another, by —O—, —S—, —NH—, —NR$^0$—, —SiR$^0$R$^{00}$—, —CO—, —COO—, —OCO—, —O—CO—O—, —S—CO—, —CO—S—, —CX$^1$=CX$^2$— or —C≡C— in such a manner that O and/or S atoms are not linked directly to one another,
$R^0$ and $R^{00}$ are, independently of each other, H, or optionally substituted aryl or alkyl with 1 to 12 C-atoms,
$X^1$ and $X^2$ are, independently of each other, H, F, Cl or CN,
n is an integer >1.

12. A formulation according to claim 1, wherein the concentration of the organic semiconducting compound is 0.1 to 10%.

13. A formulation according to claim 1, wherein the solvent has a polar contribution to the Hansen solubility parameter of <6 Mpa$^{1/2}$.

14. A formulation according to claim 1, wherein the organic solvent is a non-alcoholic aliphatic and aromatic hydrocarbon, or a halogenated aliphatic and aromatic hydrocarbon.

15. A formulation according to claim 1, wherein the organic solvent is xylene, toluene, benzene, tetralin, indane, dichlorobenzene, chloroform, dichloromethane, cyclohexane, anisole, N-methyl-2-pyrrolidone, dimethyl sulfoxide, cyclohexanone, dioxane, tetrahydrofuran, γ-butyrolactone or a mixture thereof.

16. An organic semiconductor layer obtainable by providing a formulation according to claim 1 onto a substrate and optionally removing the solvent.

17. A semiconducting, electrically conducting, photoconducting or light-emitting material in an optical, electrooptical or electronic component or device, organic field effect transistor, integrated circuitry, thin film transistor, flat panel display, radio frequency identification tag, electroluminescent or photoluminescent device or component, organic light emitting diode, backlight of a display, organic photovoltaic device, sensor device, charge injection layer, Schottky diode, planarising layer, antistatic film, conducting substrate or pattern, electrode material in a battery, photoconductor, electrophotographic application, electrophotographic recording, organic memory device, alignment layer, cosmetic or pharmaceutical composition or a detecting or discriminating DNA sequence comprising a formulation according to claim 1.

18. A semiconducting, electrically conducting, photoconducting or light-emitting component or device, comprising a formulation according to claim 1, or a layer obtainable by providing said formulation onto a substrate.

19. An integrated circuitry, organic field effect transistor, thin film transistor, organic photovoltaic device, radio frequency identification tag or organic light emitting diode, comprising a formulation according to claim 1, or a layer obtainable by providing said formulation onto a substrate.

20. A security marking or device comprising an organic field effect transistor or radio frequency identification tag according to claim 19.

21. A method of preparing a formulation according to claim 1, comprising mixing together
an organic semiconducting compound,
a hydrophobic surfactant containing a head group that is a chlorosilane, silazane or thiol group and a tail group that is an alkyl, fluoroalkyl or siloxane group, and
a non-alcoholic organic solvent.

22. A formulation according to claim 1, wherein the surfactant is 1,1,1,3,3,3-Hexamethyldisilazane, octyl trichlorosilane, or octadecyl trichloro silane.

23. A formulation according to claim 1, wherein the hydrophobic surfactant consists of a head group that is a chlorosilane containing a silicon-chlorine bond, silazane or thiol group and a tail group that is an alkyl, fluoroalkyl or siloxane group.

24. A formulation comprising three separate compounds (A), (B) and (C) which compounds are not identical, wherein
(A) is an organic semiconducting compound,
(B) is a hydrophobic surfactant containing a head group that is a chlorosilane containing a silicon-chlorine bond, silazane or thiol group and a tail group that is an alkyl, fluoroalkyl or siloxane group, and
(C) is a non-alcoholic organic solvent.

25. A formulation according to claim 24, wherein the hydrophobic surfactant consists of a head group that is a chlorosilane containing a silicon-chlorine bond, silazane or thiol group and a tail group that is an alkyl, fluoroalkyl or siloxane group.

* * * * *

UNITED STATES PATENT AND TRADEMARK OFFICE
CERTIFICATE OF CORRECTION

PATENT NO.       : 8,314,416 B2
APPLICATION NO.  : 11/727043
DATED            : November 20, 2012
INVENTOR(S)      : Shkunov et al.

It is certified that error appears in the above-identified patent and that said Letters Patent is hereby corrected as shown below:

Column 12, line 42 reads "eroaryl, or straight-hain, branched or cyclic alkyl with 1" should read -- eroaryl, or straight-chain, branched or cyclic alkyl with 1 --.

Signed and Sealed this
Nineteenth Day of March, 2013

Teresa Stanek Rea
*Acting Director of the United States Patent and Trademark Office*